United States Patent [19]

Kagaya et al.

[11] Patent Number: 5,523,593
[45] Date of Patent: Jun. 4, 1996

[54] COMPOUND SEMICONDUCTOR INTEGRATED CIRCUIT AND OPTICAL REGENERATIVE REPEATER USING THE SAME

[75] Inventors: Osamu Kagaya, Kokubunji; Hiroyuki Takazawa, Hino; Yoshinori Imamura, Tsukui; Junji Shigeta, Fuchu; Yukihiro Kawata; Hiroto Oda, both of Akishima, all of Japan

[73] Assignees: Hitachi, Ltd., Tokyo; Hitachi VLSI Engineering Corporation, Kodaira, both of Japan

[21] Appl. No.: 36,787

[22] Filed: Mar. 25, 1993

[30] Foreign Application Priority Data

Mar. 30, 1992 [JP] Japan ................................. 4-073682
Mar. 31, 1992 [JP] Japan ................................. 4-076604
Apr. 6, 1992 [JP] Japan ................................. 4-083650

[51] Int. Cl.$^6$ ..................... H01L 29/778; H01L 31/0352
[52] U.S. Cl. .......................... 257/192; 257/195; 257/280; 257/514; 257/547
[58] Field of Search ........................ 257/195, 513, 257/280, 275, 514, 520, 547, 192

[56] References Cited

U.S. PATENT DOCUMENTS 4,470,062 9/1984 Muramatsu ............................. 257/520
5,254,863 10/1993 Battersby ............................. 257/192

FOREIGN PATENT DOCUMENTS 62-133768 6/1987 Japan ................................. 257/195
249465 2/1990 Japan .
387044 4/1991 Japan .

Primary Examiner—Jerome Jackson, Jr.
Attorney, Agent, or Firm—Kenyon & Kenyon

[57] ABSTRACT

By forming an isolated semiconductor layer or electrode layer on a semiconductor surface between neighboring field effect transistors and element separating trenches which are deep enough to reach at least the semi-insulating substrate or the hetero junction interface on the buffer layer, low frequency oscillation of a compound semiconductor integrated circuit can be reduced. By controlling the thickness of the buffer layer having a hetero junction to at most 150 nm, the low frequency oscillation can be reduced. By forming materials separating adjacent elements with a width of at most 2 μm which reach from the element region surface to the buffer layer having hetero junction so as to enclose the element regions and etched regions in the neighborhood of the elements or so as to enclose the element regions in the etched regions and by controlling the angle of the sides of the etched regions against the semiconductor layer surface to 10° to 60°, wires can be prevented from short-circuiting.

24 Claims, 14 Drawing Sheets

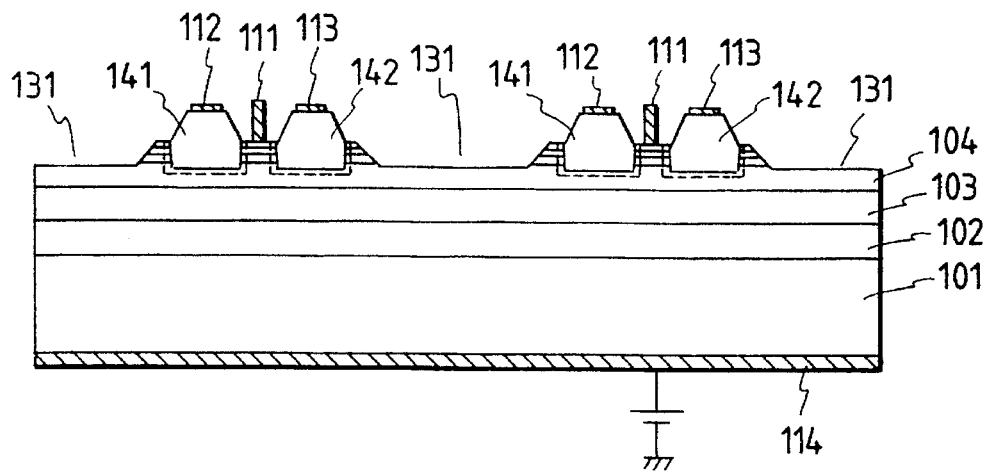
FIG. 18
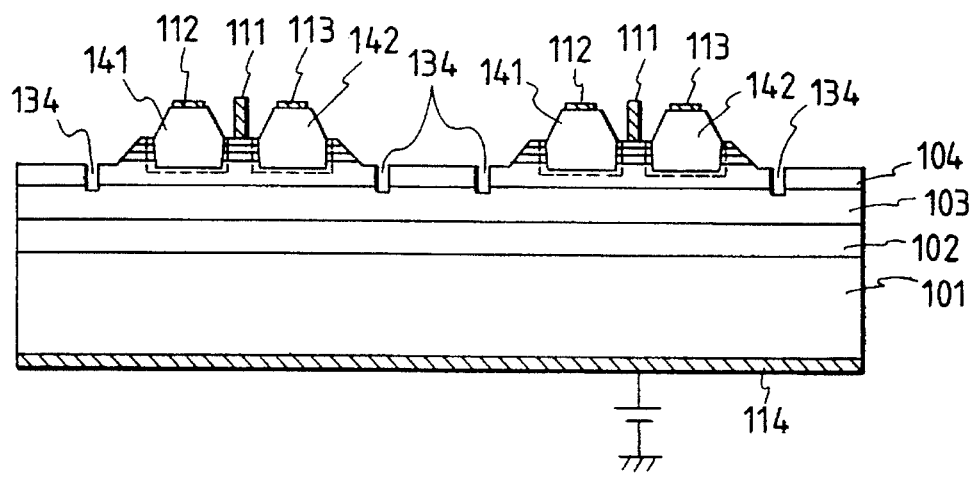
FIG. 19
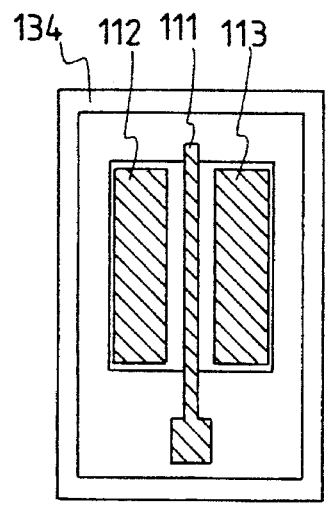 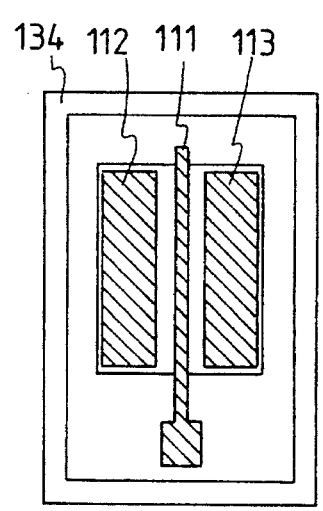
FIG. 20A   FIG. 20B

DEPTH FROM SMICONDUCTOR DEVICE SURFACE TO AℓGaAs LAYER d (nm)

COMPOUND SEMICONDUCTOR INTEGRATED CIRCUIT AND OPTICAL REGENERATIVE REPEATER USING THE SAME

BACKGROUND OF THE INVENTION

The present invention relates to a compound semiconductor integrated circuit using superspeed field effect transistors (FETs) and an optical regenerative repeater using such a circuit and more particularly to a compound semiconductor integrated circuit having an element separating structure which is suited to increase operation speed.

The distance between elements forming an integrated circuit has been reduced as the high integration of semiconductor integrated circuits has been recently improved. With the reduction of the inter-element distance, a problem which is called a sidegate effect is imposed. The sidegate effect is a phenomenon that a current flowing through a field effect transistor (FET) is decreased or the threshold voltage is changed by the electric interaction between the FET and other elements.

When creating an amplifier circuit with a high gain using FETs having compound semiconductors, it is important to control the sidegate effect as well as a phenomenon which is called low frequency oscillation. The phenomenon of low frequency oscillation is a phenomenon in which a current flowing through an FET in an integrated circuit self-oscillates stationarily even if no signal is inputted and is called "low frequency oscillation" because the oscillation frequency is very low, such as several Hz at room temperature.

A conventional compound semiconductor integrated circuit using FETs is indicated, for example, in Japanese Patent Application Laid-Open No. 2-49465. As shown in FIG. 3 of this application, the compound semiconductor integrated circuit has element separating zones 39, which reach a semi-insulating GaAs substrate 31, between neighboring FETs (T1, T2, T3) so as to improve the electric separation between the FETs, particularly the sidegate effect. In FIG. 3, symbols T1, T2, and T3 indicate FETs which are called HEMT, numeral 32 an undoped GaAs buffer layer, 33 an n type AlGaAs electron supply layer, 34 an n type GaAs contact layer, 35 an ohmic electrode, 37 a gate electrode, and 38 an element separating zone which does not reach the substrate 31.

Another conventional example is indicated, for example, in Japanese Patent Application Laid-Open No. 3-87044. As shown in FIG. 4 of this application, the compound semiconductor integrated circuit has a hetero-junction buffer layer 42 with a thickness of 1000 Å, which is made of AlGaAs, under the GaAs FETs and element separating trenches 46, which reach a hetero junction interface 44, between the neighboring FETs so as to improve the electric separation between the FETs, particularly the sidegate effect. In FIG. 4, numeral 41 indicates a semi-insulating GaAs substrate, 43 a GaAs layer, 45 an ohmic electrode, 47 and 48 ohmic electrodes, and 49 a gate electrode. The element separating trenches 46 may be filled with an insulator so as to form material separating adjacent elements. In this case, due to the element separating trenches 46 or furthermore the insulator with which the trenches are filled, it is necessary that a leakage current between the elements would have to pass through the hetero-junction interface 44. However, the leakage current is prevented by the energy barrier of the hetero junction interface 44 and does not flow into the neighboring elements.

According to the above prior art, the control effect for low frequency oscillation is imperfect and an integrated circuit by the prior art performs a faulty operation. For example, when a limit amplifier with a gain of 50 dB is created, low frequency oscillation generated in the integrated circuit is amplified and low frequency oscillation noise which is large enough to saturate the output amplitude often occurs.

According to the prior art, the element separating trenches are formed by the dry etching method, so that the sides of the element separating trenches are almost perpendicular to the surface of the semiconductor integrated circuit. Therefore, the insulator surface in the neighborhood of each side of the element separating trenchers which are filled with an insulator is not sufficiently flat (a level difference is generated) and the wiring metal deposited on the insulator surface is not uniform in thickness, for example, the wiring metal formed in each trench is thick. As a result, in the wiring metal etching process for forming wires, an etching residue is generated in each trench and wires are connected, that is, short-circuited. As a method for solving this problem, a method for forming element separating etched regions by the wet etching method instead of the dry etching method is possible. It is known that by the wet etching method, each side that is a part of a material to be etched which is removed by etching is formed as a slope and the slope can be processed in an inclined state toward the center of the part to be removed by etching in the depth direction from the surface. Therefore, when an element separating etched region with such a shape is filled with an insulator, the insulator surface in the neighborhood of the etched region is flat and the wiring metal deposited on the insulator surface is uniform in thickness. As a result, the problem of short-circuiting of wires can be solved. However, when an etched region is formed by the wet etching method, a new problem is imposed in that the integration density is reduced by the area required for the side slope.

SUMMARY OF THE INVENTION

The present invention proposes an element separating structure which can reduce low frequency oscillation and provide a compound semiconductor integrated circuit which is most suitable for a superspeed operation and an optical regenerative repeater using this integrated circuit.

The present invention solves the problem of short-circuiting of wires without the integration density of the element separating structure of the semiconductor integrated circuit being reduced so much compared with that when the wet etching method is used.

To accomplish this, an isolated semiconductor layer is formed on the semiconductor surface between neighboring field effect transistors by selective growth first and furthermore an element separating trench which is deep so as to reach at least a semi-insulating substrate or a hetero junction interface on the buffer layer is formed.

Therefore, in a compound semiconductor integrated circuit having a plurality of field effect transistors which are formed on the semi-insulating substrate by epitaxial growth, an isolated semiconductor layer which is grown selectively is formed on the semiconductor surface between the neighboring field effect transistors and an element separating trench, which is deep so as to reach at least the semi-insulating substrate, is formed between the neighboring field effect transistorize.

Furthermore, in a compound semiconductor integrated circuit having a plurality of field effect transistors including a hetero-junction buffer layer, an isolated semiconductor layer which is grown selectively is formed on the semiconductor surface between the neighboring field effect transistors, and an element separating trench which is deep so as to reach at least the hetero-junction interface is formed between the neighboring field effect transistors. In this case, the suppression of the sidegate effect is further improved.

The above element separating trench may be filled with an insulator such as $SiO_2$ when necessary so as to form a material that separates adjacent elements. In this case, wires can be formed on it. It is necessary that the element separating trench is generally at a distance of not more than 10 μm from the corresponding element (it may be in contact with the element). When the distance between the element separating trench and element is more than 10 μm, the inter-element distance is undesirably large. There are no restrictions imposed on the width of an element separating trench so long as the element separating trench can be produced between the semiconductor layer and element. When the element separating trench is filled with an insulator and a wiring layer is formed on the surface, it is desirable to control the trench width to at most 2 μm so as to facilitate wiring.

The isolated semiconductor layer may be of type n or p so long as it is made conductive; concretely the impurity concentration is at least $10^{17}/cm^3$. The isolated semiconductor layer may be replaced with an isolated ohmic electrode. The thickness of the isolated semiconductor layer can be decreased as the impurity concentration increases. When the impurity concentration is, for example, $10^{18}/cm^3$ the thickness is at least 100 nm. The thickness may be determined by a simple experiment when necessary. There are no restrictions imposed on the width and length of an isolated semiconductor layer so long as there are no problems on the production technique. It is desirable that the interval between isolated semiconductor layers is shorter than the width of each isolated semiconductor layer. When the interval is excessively wide, the thickness uniformity of isolated semiconductor layers is reduced. Isolated semiconductor layers may be formed on any layer under the element structural layer.

We have analyzed the mechanism of low frequency oscillation and obtained the following results. When a negative DC voltage applied to the element on the substrate surface with respect to the electrode on the back of the substrate is increased to a certain value, the current flowing between the substrate electrode and element on the surface starts oscillation at a low frequency ranging from 0.4 Hz to 5 Hz. When a semi-insulating GaAs substrate with a thickness of 600 μm is used, the current is about several nA and the oscillation amplitude is extremely small such as at most 1 nA. It is understood that this phenomenon is caused because the semi-insulating GaAs substrate has a negative resistance due to existence of deep levels and a high electric field domain travels from the surface element toward the backside substrate electrode.

However, when an FET neighboring with the element exists, according to the conventional element separating technique, the high electric field domain traveling between the element and substrate electrode changes the potential at the lower part of the channel of the FET and affects the drain current of the FET greatly. For example, the oscillation amplitude which appears in the drain current of FETs with a gate width of 50 μm which are neighboring with each other at a distance of 40 μm is so large such as at least 100 μA, that the current oscillation seriously obstructs the circuit operation.

Therefore, by controlling a phenomenon that a microcurrent between the element and substrate electrode oscillates, the drain current of FET can be prevented from oscillation and the low frequency oscillation of an integrated circuit can be suppressed.

FIG. 5 is a graph showing the result of the present invention. The vertical axis indicates the oscillation amplitude of a current when −10 V is applied between the electrode on the back of the substrate and the element on the substrate surface and the horizontal axis indicates the depth of the element separating trench. The element separating trench reaches the semi-insulating substrate at 0.4 μm in depth in the horizontal axis. According to the conventional structure wherein no isolated semiconductor layer is formed, even if element separating trenches are formed between FETs and the separating trenches are made deep, the low frequency oscillation is not improved. However, according to a structure that isolated semiconductor layers are formed around the element, when each element separating trench is at least 0.4 μm in depth so that it reaches the semi-insulating substrate, it is found that the oscillation amplitude is reduced to at most 0.2 nA and the low frequency oscillation is remarkably improved. According to the present invention, the oscillation of the microcurrent between the element and substrate is controlled like this, so that the drain current of neighboring FETs does not oscillate and no oscillation noise appears in the circuit operation.

In a compound semiconductor integrated circuit having a hetero junction buffer layer and a plurality of field effect transistors, when the thickness of the buffer layer is more than 100 nm, desirably at least 130 nm, or more desirably at least 150 nm, the sidegating threshold voltage can be increased and the low frequency oscillation can be reduced. Furthermore, by forming an element separating trench which is deep so that it reached at least the buffer layer or hetero junction interface, the sidegating threshold voltage is further increased. By forming the aforementioned isolated semiconductor layers, the element separating effect is further improved and the low frequency oscillation is remarkably reduced.

Recently, we have created a GaAs FET using an $Al_xGa_{1-x}As$ layer (buffer layer) with a thickness of 100 nm which is of a conventional structure and studied the low frequency oscillation. The result shows first that there is an area wherein no low frequency oscillation can be prevented by the conventional structure. The oscillation threshold voltage of low frequency oscillation will be explained with reference to FIG. 22. A characteristic line 151 is obtained when the thickness of a non-doped $Al_xGa_{1-x}As$ layer 103 (FIG. 14) is 100 nm. In this case, when the depth d (FIG. 14) from thee semiconductor device surface to the non-doped $Al_xGa_{1-x}As$ layer 103 is smaller than 200 nm, the oscillation threshold voltage is between −5 V and −9 V. When the depth d is 300 nm, the oscillation threshold voltage is more than −20 V. Therefore, when the thickness of the non-doped $Al_xGa_{1-x}As$ layer 103 is 100 nm, it is necessary to increase the depth d to at least 300 nm so as to increase the oscillation threshold voltage of low frequency oscillation.

However, when the depth d is increased to at least 300 nm, problems are imposed when an element separating trench which reaches the non-doped $Al_xGa_{1-x}As$ layer 103 (FIG. 14) is formed. These problems include: (1) When an etched region is formed by the wet etching method, the active layer is also etched by etching in the lateral direction and the probability that transistors will be rejected is larger than when an etched region is formed by the dry etching method; (2) When a trench is formed by the dry etching method, the trench is deed and perpendicular, so that it is difficult to make it smooth. To solve these two problems, a trench with a depth d of less than 300 nm is necessary. A single buffer layer or a plurality of buffer layers may be used. When a plurality of buffer layers are used, the total thickness is required to be the above value.

According to the present invention, as shown in FIG. 14, a plurality of field effect transistors are formed on a crystal surface having a structure that a non-doped GaAs layer 102, a non-doped $Al_xGa_{1-x}As$ layer 103 with a total thickness of at least 150 nm, a p type GaAs layer 104, and an n type GaAs active layer 105 are laminated on a semi-insulating GaAs substrate one by one and etched regions 131 with a depth of less than 300 nm are formed between the above field effect transistors. The range of x is from 0.1 to 0.45.

In FIG. 14, numeral 111 indicates a gate electrode, 112 a source electrode, and 113 a drain electrode.

When the $Al_xGa_{1-x}As$ layer 103 (FIG. 14) is formed more than 100 nm in total thickness, desirably at least 130 nm, or more desirably at least 150 nm, the oscillation threshold voltage of low frequency oscillation is increased.

By forming trenches which reach the $Al_xGa_{1-x}As$ buffer layer 103 (FIG. 19) between the field effect transistors, the sidegating threshold voltage is increased. Furthermore, by forming an $Al_xGa_{1-x}As$ layer more than 100 nm in thickness, desirably at least 130 nm, or more desirably at least 150 nm, the depth from the semiconductor device surface to the $Al_xGa_{1-x}As$ layer 103 can be reduced and the depth of element separating trenches 134 which reach the $Al_xGa_{1-x}As$ layer 103 can be reduced.

Next, the object for obtaining an element separating structure of a semiconductor integrated circuit wherein the integration density is high and no wires are short-circuited can be accomplished by forming an etched region at least on the gate pad (indicated by numeral 270 in FIGS. 27 and 29) side of the element region, by forming a material separating adjacent elements with a width of at most 2 μm which reaches a semi-inoculating semiconductor configuring hetero-junction from the surface of the element region so as to enclose the periphery of the element region and etched region or so as to enclose the periphery of the above element region in the above etched region, and by forming the side of the above etched region in the gate width direction or the side of the above etched region where wired formed on an insulator pass through as a slope which is inclined from the surface of the above element region toward the center of the above etched region in the depth direction.

Therefore, i)it is possible to form the material separating adjacent elements so as to enclose the periphery of the element region and etched region and to form the side of the etched region in the gate width direction as a slope which is inclined from the surface of the element region toward the center of the etched region in the depth direction or ii) it is possible to form the etched region so as to enclose the periphery of the element area, to form the material separating adjacent elements in the etched region so as to enclose the periphery of the element region, to fill the etched region with an insulator, and to form the side of the etched region where wires of the insulator pass through as a slope which is inclined from the surface of the element region toward the center of the etched region in the depth direction. The angle (for example, θ in FIGS. 28 and 30) between the above slope and semiconductor layer surface in the element region ranges from 10° to 60°. When the angle is larger than 60°, the slope is almost perpendicular to the semiconductor layer and the effect of the present invention is reduced. When the angle is smaller than 10°, the inter-element interval is undesirably increased. By using the above structure that the etched region and material separating adjacent elements are combined together with the above structure using the isolated semiconductor layers and/or a structure having a buffer layer with a thickness of more than 100 nm, a superior result having the advantage of each structure can be obtained.

Firstly, the operation in i) will be explained. The etched region in i) operates to specify the element region. The side having a slope operates to prevent the gate pad from disconnection. The material separating adjacent elements with a width of at most 2 μm operates the wires from short-circuiting. It is obviously shown in FIG. 31 where when the width X of the material separating adjacent elements is not more than 2 μm, the level difference Z is sufficiently small. Since the element region is enclosed by the material separating adjacent elements, a leakage current can be prevented more perfectly. By doing this, the distance between neighboring elements can be shortened, so that the integration density can be retained.

Next, the operation in the case of ii) will be explained. Since the etched region is formed above the material separating adjacent elements, the etched region and material separating adjacent elements operate to separate the elements. Therefore, it is obvious that the wire short-circuit prevention is improved in the etched region which is effective in short-circuit prevention. Furthermore, the depth of the material separating adjacent elements can be shortened by the depth of the etched region, so that the effect of shoot-circuit prevention in this part is improved. This is obviously shown in FIG. 31. In other words, it is obviously shown in FIG. 31 that when the depth Y of the material separating adjacent elements is shortened, the level difference Z is decreased. Since the element region is enclosed by the material separating adjacent elements, a leakage current can be prevented more perfectly. By doing this, the distance between neighboring elements can be shortened, so that by forming an etched region in this state, a reduction in the integration density can be compensated for and the integration density can be retained.

According to the semiconductor integrated circuit of the present invention, the wiring layer and surface protection layer may be the same as before.

According to a compound semiconductor integrated circuit having a hetero-junction buffer layer and element separating trenches which reach the hetero junction interface, both the energy difference between the Fermi level and the bottom of the conduction band and the energy difference between the Fermi level and the top of the valence band for the buffer layer are larger than those for the semiconductor layer (on the opposite side of the substrate) which is heterojointed with the buffer layer.

When the compound semiconductor integrated circuit of the present invention mentioned above is used, a hyperfunctional optical regenerative repeater which operates normally, for example, at 10 GB per second can be obtained.

BRIEF DESCRIPTION OF THE DRAWINGS

FIGS. 15 to 18 are sectional views showing the processes for manufacturing the semiconductor device of Embodiment 6 of the present invention.

FIG. 19 is a sectional view of the semiconductor device of Embodiment 7 of the present invention.

FIGS. 20A and 20B plan views of the semiconductor device of Embodiment 8 of the present invention

DETAILED DESCRIPTION

Embodiment 1

Figure 1:
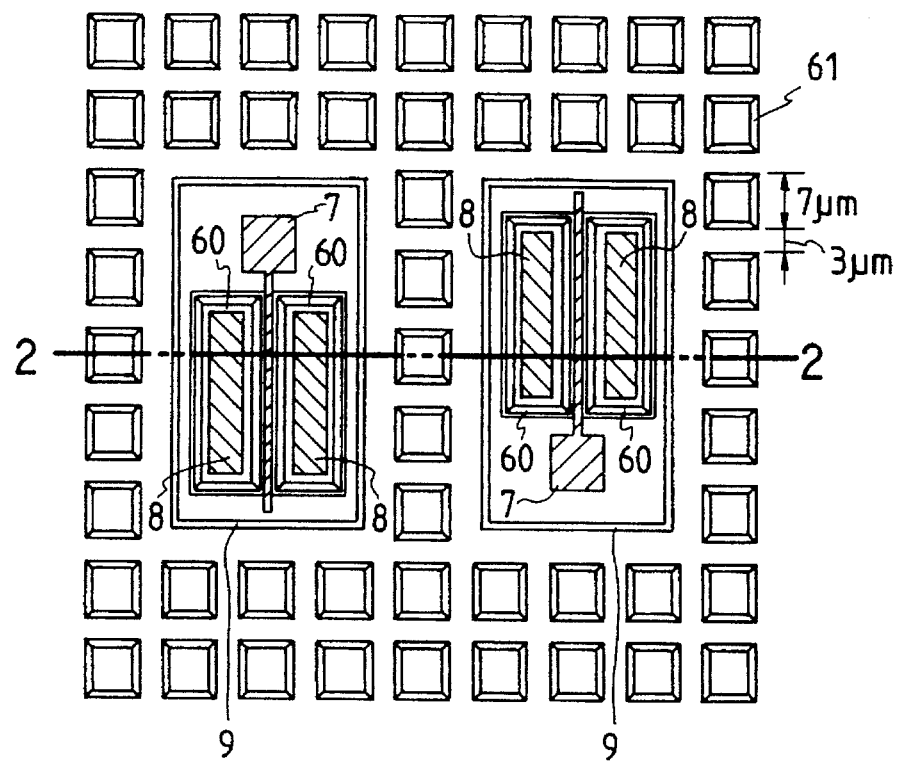
FIG. 1 is a plan view of the element separating structure of Embodiment 1 of the present invention.
Figure 2:
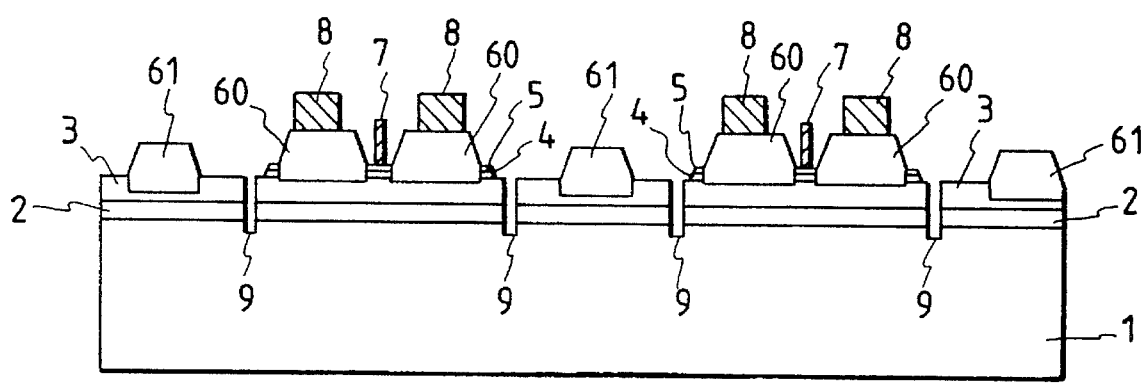
FIG. 2 is a sectional view of field effect transistors and the element separating structure of Embodiment 1 of the present invention.
Figure 3:
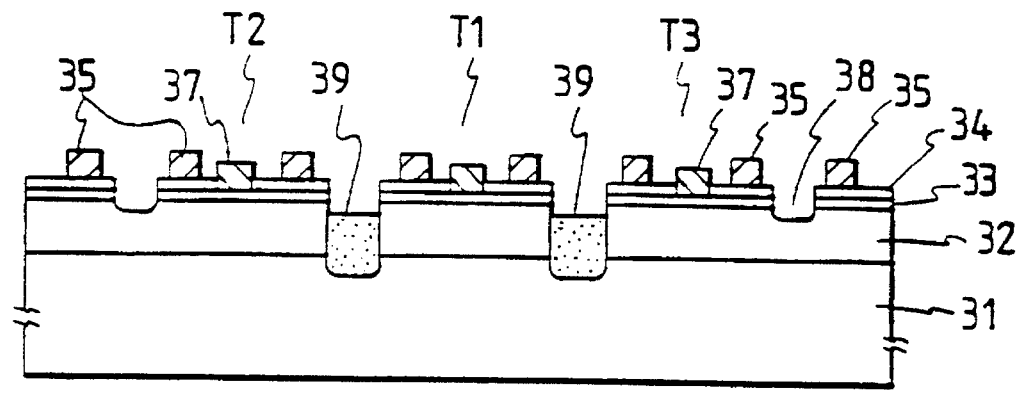
FIG. 3 is a sectional view showing an example of a conventional element separating structure.
Figure 4:
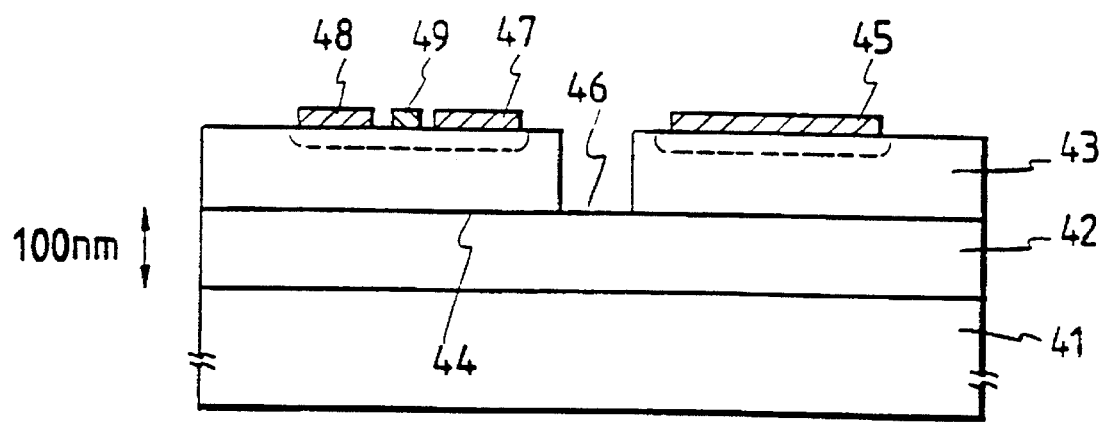
FIG. 4 is a sectional view showing another example of a conventional element separating structure.
Figure 5:
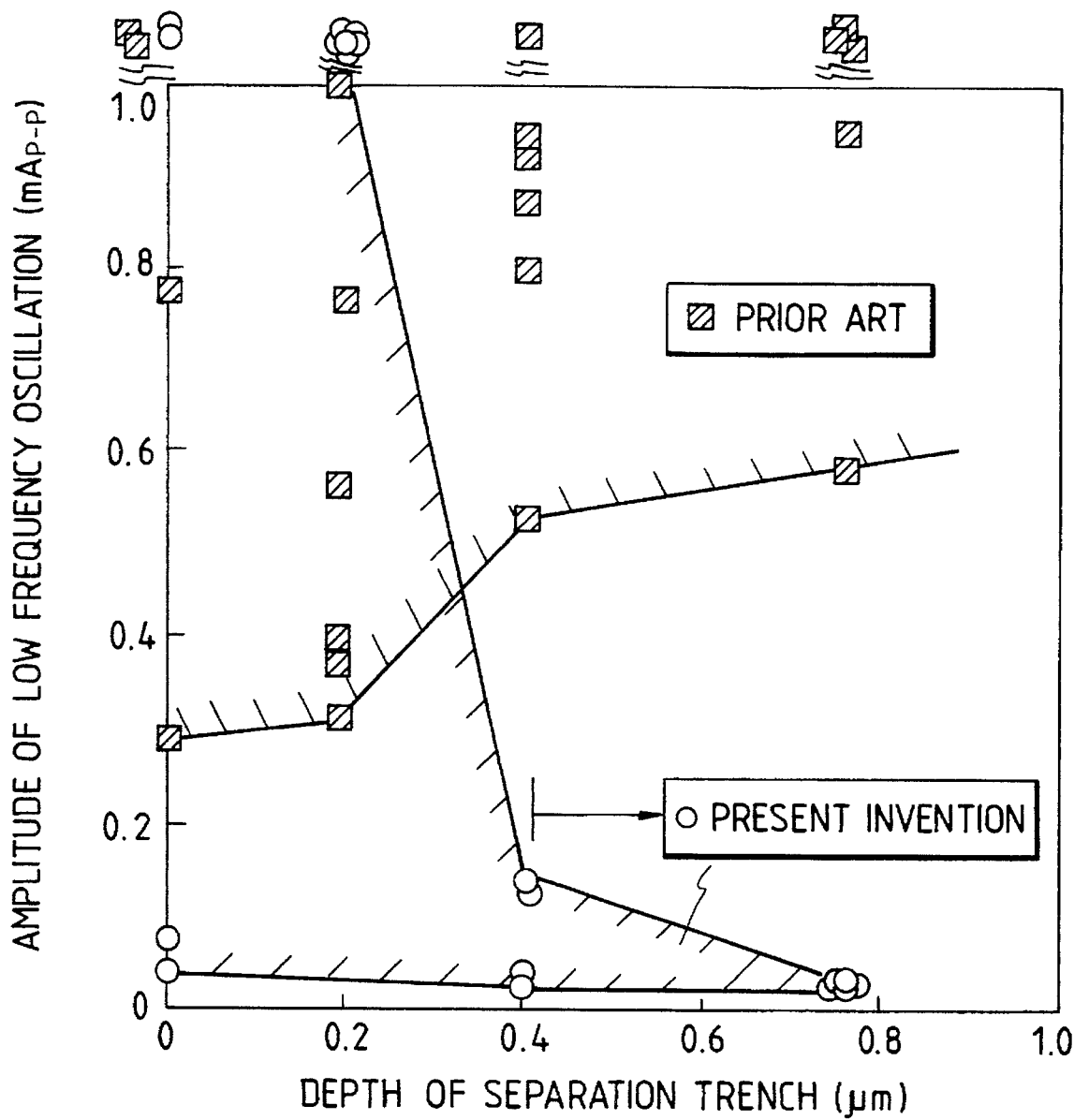
FIG. 5 is a graph showing the effect of the present invention.

Next, Embodiment 1 of the present invention will be explained with reference to FIGS. 1, 2, and 6A through 6E. FIG. 1 is a plan view of the element separating structure, and FIG. 2 is a sectional structure diagram of FETs which are called HIGFET (heterostructure insulated-gate FET) and of the element separating structure, and FIGS. 6A–6E are sectional structure diagrams showing the manufacturing process of the above structure.

Figure 6A:
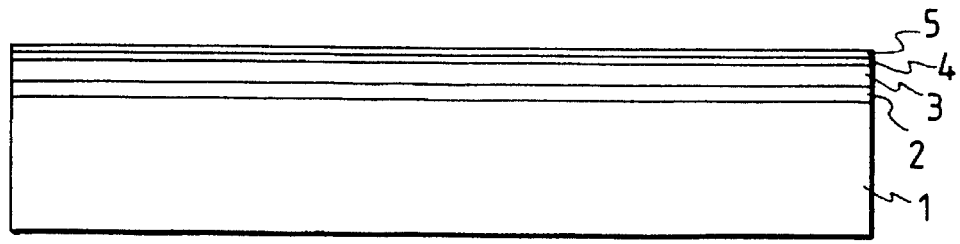
FIGS. 6a–e are sectional structure diagrams for explaining the production process of the field effect transistors and element separating structure of Embodiment 1 of the present invention.

Firstly, the manufacturing process will be explained. In FIG. 6(a), an undoped GaAs buffer layer 2, p type GaAs layer 3, n type GaAs active layer 4, and undoped AlGaAs layer 5 are allowed to grow continuously one by one on a semi-insulating GaAs substrate 1 by the MBE (molecular beam epitaxial) method. The suitable substrate temperature during growth is about 510° C. The thickness of each layer and impurity concentration are as shown in Table 1. An undoped LEC substrate (a substrate which is formed by crystal growth by the liquid encapsulated Czockralski method) or Cr doped LEC substrate is generally used as a semi-insulating GaAs substrate 1. The composition ratio of the undoped AlGaAs layer 5 which is generally selected is $Al_{0.3}Ga_{0.7}As$.

TABLE 1

| Layer name | Grown layer thickness (nm) | Impurity concentration (l/cm³) | Impurity |
|---|---|---|---|
| Undoped AlGaAs layer 5 | 24 | — | — |
| n type GaAs active layer 4 | 15 | $3.6 \times 10^{18}$ | Si |
| p type GaAs layer 3 | 300 | $3.0 \times 10^{16}$ | Be |
| Undoped GaAs buffer layer 2 | 300 | — | — |

Figure 6B:
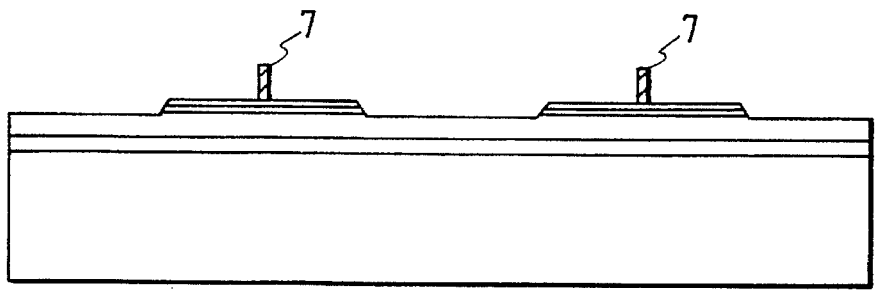

Next in FIG. 6(b), the parts which are to be formed as FETs are covered with a $SiO_2$ film and the semiconductor surface on the other parts is etched by a wet etching liquid. The etching depth is 200 nm. Next, the $SiO_2$ film is removed, and a WSix (tungsten silicide) film with a thickness of 600 nm is deposited on the parts by the sputtering method, and refractory gate electrodes 7 are formed by photolithography and dry etching. The suitable composition ratio x of Si is 0.45. To decrease the resistance between source electrode and gate electrode, Si ions may be implanted after the refractory gate electrodes 7 are formed. The ion implantation conditions in this case are that the acceleration energy is 40 keV and the dose amount is $1 \times 10^{14}/cm^2$.

Figure 6C:
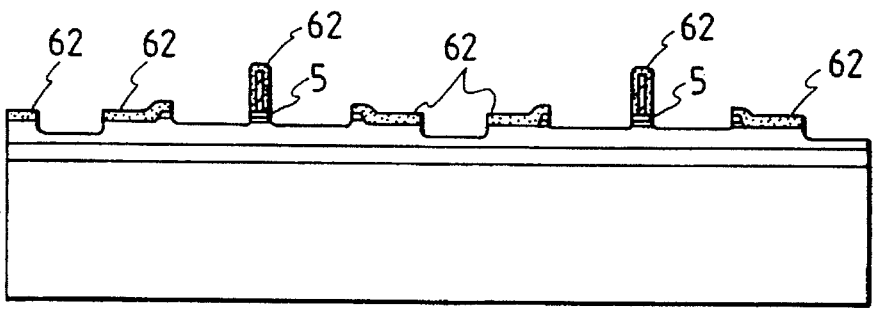

Next in FIG. 6(c), a SiON (silicon oxi-nitride) layer 62 with a thickness of 100 nm is deposited on the entire surface by the plasma CVD method and the SiON layer at the parts of FET source and drain electrodes and of an isolated semiconductor layer is etched by the photolithographic method and reactive ion etching method so as to form windows. $CF_4$ gas and $O_2$ gas are generally used as etching gas. Thereafter, the semiconductor surface is further etched by the reactive ion etching method to a depth of 70 nm so as to remove the undoped AlGaAs layer 5 at the parts of FET source and drain electrodes. $SiCl_4$ gas is used as etching gas in this case.

Figure 6D:
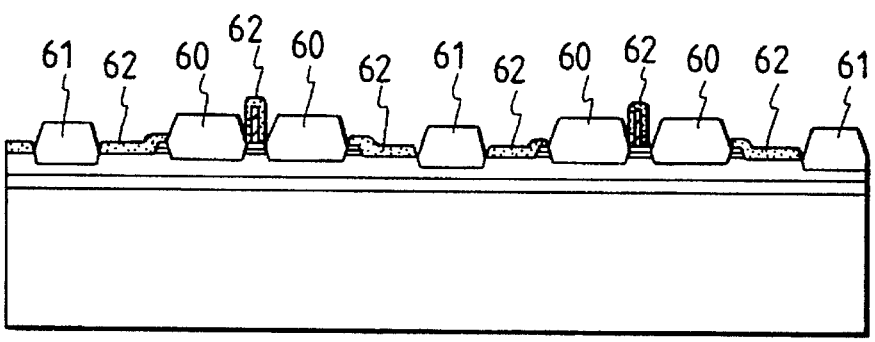

Next in FIG. 6(d), a heavily doped n type selective growth layer 60 and heavily doped n type isolated semiconductor layer 61 are allowed to grow simultaneously by the MOCVD (metal organic chemical vapor deposition) method using the formed SiON layer 62 as a mask. The temperature for growth is generally 700° C. and trimethylgallium and arsine are used as synthesis gas. The above layers 60 and 61 are comprised of a GaAs layer with a thickness of 320 nm which is doped with Si or Se at a concentration of $4 \times 10^{18}/cm^3$. The shape of the heavily doped n type isolated semiconductor layer 61 is a square 7 μm on a side as shown in FIG. 1 and the squares are lined at even intervals of 3 μm.

Figure 6E:
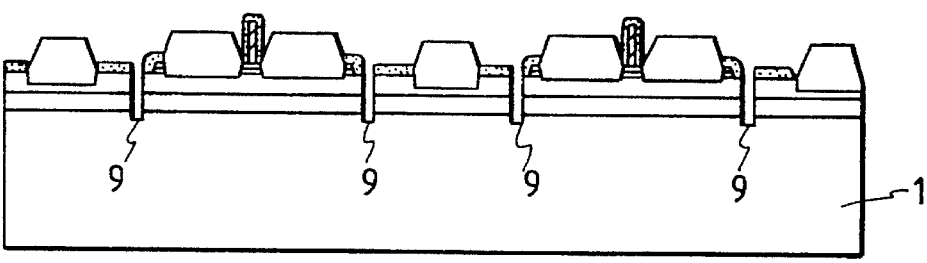

Next in FIG. 6(e), the SiON layer 62, p type GaAs layer 3, and undoped GaAs buffer layer 2 are etched by the photolithographic method and reactive ion etching method so as to form element separating trenches 9 which reach the semi-insulating substrate 1. The width of the etched trenches is 1 μm and the depth thereof is 0.5 μm so as to reach the semi-insulating GaAs substrate 1. Each etched trench 9 is shaped so as to enclose the periphery of each FET as shown in FIG. 1. The squares of the heavily doped n type isolated semiconductor layer 61 are arranged so as to enclose the periphery of each etched trench 9. Particularly when the etched trenches 9 are processed under the condition that a reactive ion etching method which is called electron cyclotron resonance (ECR) is used, and $SiCl_4$ is used as etching gas, and the microwave discharge power density is 1.54 $kW/m^2$, and the pressure is 44 mPa, even if trenches with a depth of 0.5 μm are formed, the side etching amount can be controlled to at most 0.2 μm and the processed shape of the etched trenches can be made satisfactory.

Hereafter, ohmic electrodes 8 are formed on the heavily doped n type selective growth layer 61 by the lift-off method and the element separating structure and field effect transistors shown in FIGS. 1 and 2 can be formed. Thereafter, wires are formed on the ohmic electrodes 8 and refractory gate electrodes 7. By doing this, the integrated circuit is completed. No wires are formed on the heavily doped n type isolated semiconductor layer 61 and the potential of each square of the layer 61 is made floating.

Figure 7:
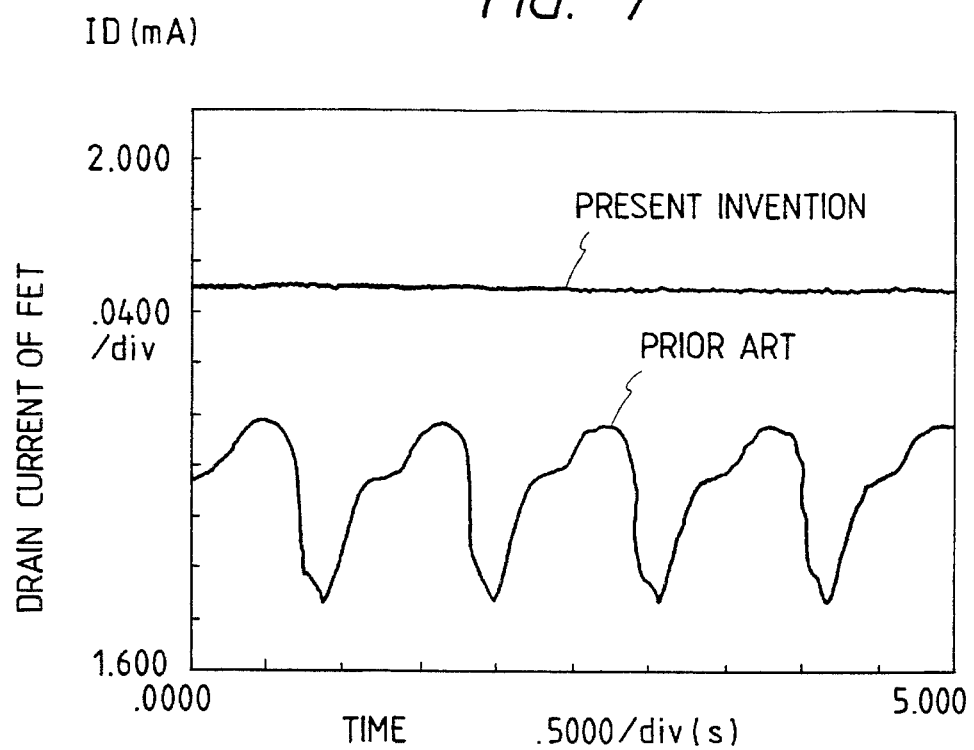
FIG. 7 is a graph showing the effect of Embodiment 1 of the present invention.

The effect of this embodiment will be explained with reference to FIG. 7. FIG. 7 is a graph of measured drain currents of neighboring FETs. The electrode voltage on the back of the substrate is 0 V, and the source potential of one side of FET is −8 V, the source potential of the target FET is −1 V, and the inter-FET interval is 40 μm. Although the oscillation amplitude of the conventional element separating structure is over 100 μA, the drain current of the element separating structure of Embodiment 1 is kept constant and the low frequency oscillation phenomenon can be prevented perfectly.

According to Embodiment 1, as mentioned above, the oscillation of a microcurrent between the FETs and substrate can be suppressed and the drain current of neighboring FETs can be prevented from low frequency oscillation.

According to Embodiment 1, the pattern densities of the heavily doped n type selective growth layer 60 and heavily doped n type isolated semiconductor layer 61 are high and almost uniform in the chip, so that the thickness of the selective growth layer by the MOCVD method can be made uniform in the wafer.

According to Embodiment 1, the FETs are HIGFETs. However, they may be MESFETs (metal-semiconductor field effect transistors) or HEMTs (high-electron mobility transistors).

Embodiment 2

Figure 8:
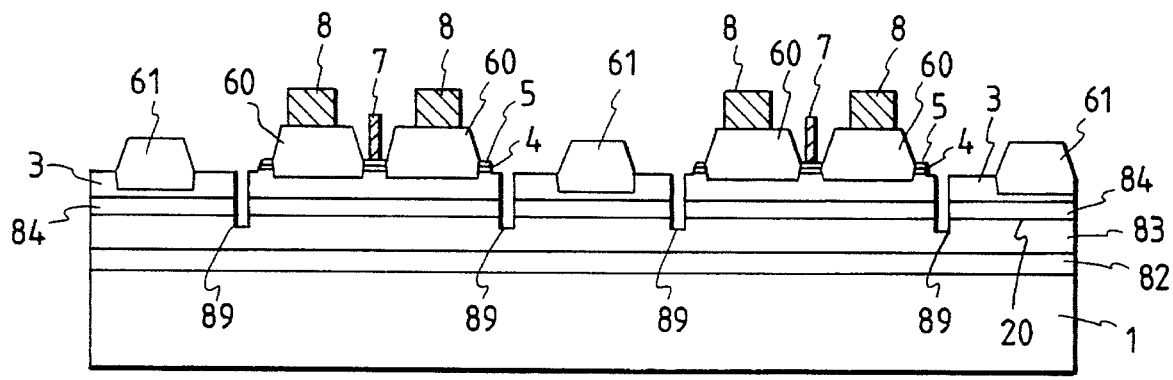
FIG. 8 is a sectional view of field effect transistors and the element separating structure of Embodiment 2 of the present invention.

Next, Embodiment 2 of the present invention will be explained with reference to FIG. 8. FIG. 8 is a sectional structure diagram of HIGFETs and the element separating structure. Differences from Embodiment 1 are that an undoped GaAs buffer layer 82, undoped AlGaAs buffer layer 83, and undoped GaAs buffer layer 84 are formed in place of the undoped GaAs buffer layer 2 and element separating trenches 89 are formed so as to reach the undoped AlGaAs buffer layer 83. The thickness of the undoped GaAs buffer layer 82 is 100 nm, and the thickness of the undoped AlGaAs buffer layer 83 is 300 nm, and the composition ratio is $Al_{0.3}Ga_{0.7}As$, and the thickness of the undoped GaAs buffer layer 84 is 300 nm. Numeral 20 indicates a hetero-junction interface.

According to Embodiment 2, the HIGFET low frequency oscillation phenomenon can be suppressed and the sidegating threshold voltage is increased, so that the inter-FET interval can be reduced to about 15 μm. As a result, the inter-FET wiring capacity and the distortion of bandwidth due to the wiring inductance are modified and the high speed of the integrated circuit can be improved. The chip area can be reduced and the production cost can be decreased.

Embodiment 3

Figure 9:
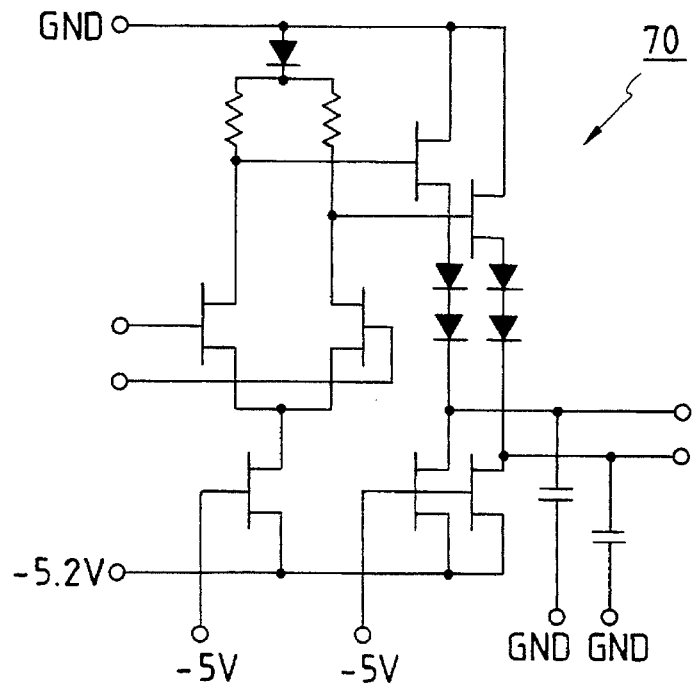
FIG. 9 is a circuit diagram of the basic amplifier of Embodiment 3 of the present invention.
Figure 10:
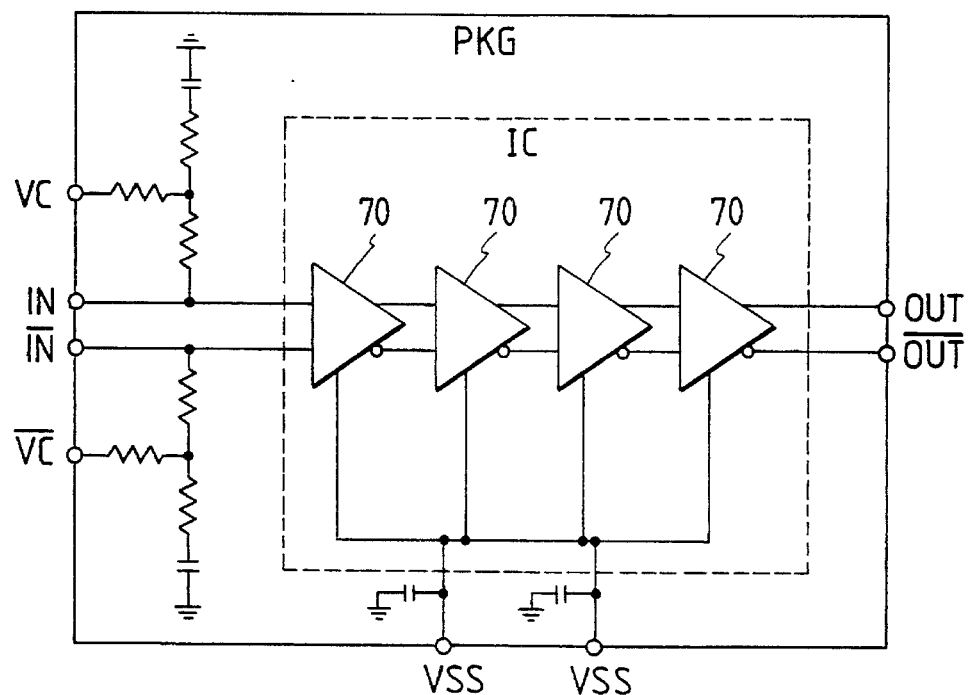
FIG. 10 is a block diagram of the limit amplifier of Embodiment 3 of the present invention.

Next, Embodiment 3 of the present invention will be explained with reference to FIGS. 9, 10, and 11. FIG. 9 is a circuit diagram of a basic amplifier 70, FIG. 10 is a block diagram of a limit amplifier, and FIG. 11 is a block diagram of an optical regenerative repeater.

Embodiment 3 is an example that the element separating structure shown in Embodiments 1 or 2 is actually applied to an integrated circuit and optical regenerative repeater. Firstly, the FET in the circuit diagram shown in FIG. 9 is a basic amplifier formed using the element separating structure shown in FIGS. 1 and 2 or the element separating structure shown in FIG. 8. An FET wherein the source and drain electrodes are short-circuited is generally used as a diode and the above element separating structure of the present invention is also used as a separating structure. HIGFETs with a gate length of 0.3 μm are used as FETs. Next, a limit amplifier integrated circuit is formed by combining four basic amplifiers 70 as shown in FIG. 10. The limit amplifier is used as a timing extracting circuit as shown in FIG. 11 so as to constitute an optical regenerative repeater for optical communication.

According to Embodiment 3, a high gain and superspeed limit amplifier having no noise due to low frequency oscillation can be realized. Furthermore, an optical regenerative repeater which operates normally at a superspeed of, for example, 10 giga bits per second can be realized.

Figure 11:
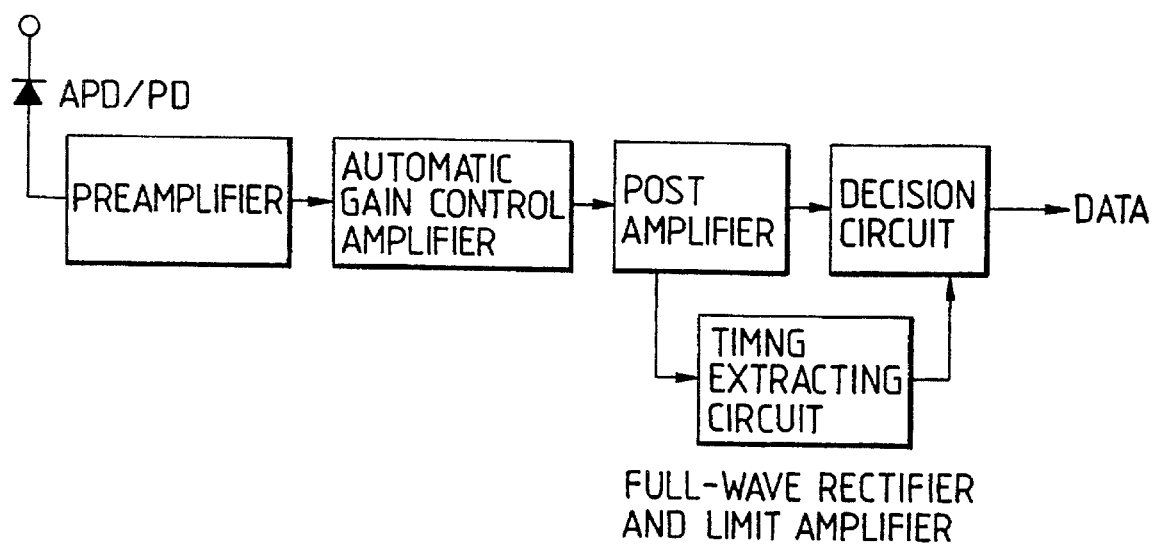
FIG. 11 is a block diagram of the optical regenerative repeater of Embodiment 3 of the present invention.

According to Embodiment 3, the basic amplifier circuit shown in FIG. 9 may be applied to the preamplifier, automatic gain control amplifier, post amplifier, and decision circuit shown in FIG. 11. By doing this, the noise due to low frequency oscillation can be suppressed in each integrated circuit and the receiving sensitivity of the optical regenerative repeater can be increased more.

Embodiment 4

Figure 12A:
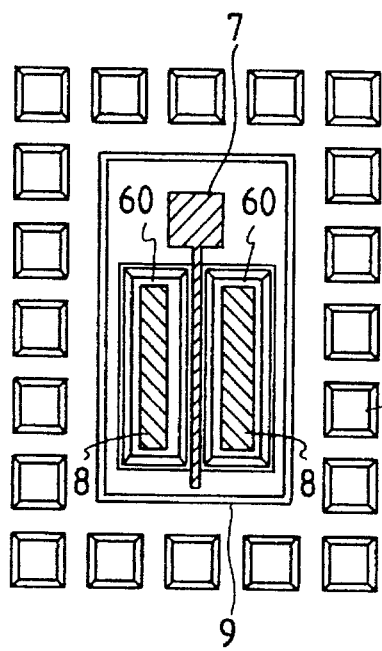
FIGS. 12A and 12B are plan views of the element separating structure of Embodiment 4 of the present invention.
Figure 12B:
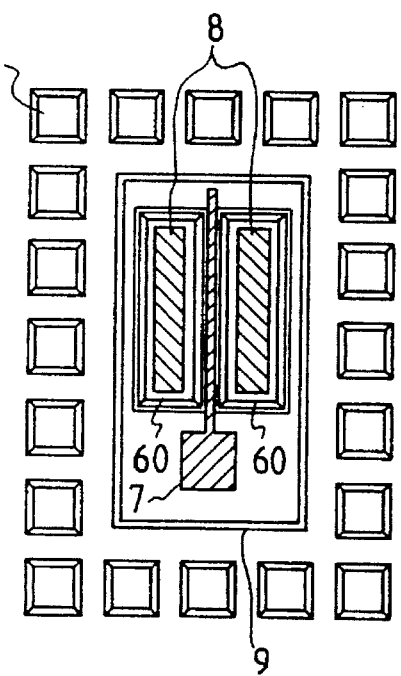

Next, Embodiment 4 of the present invention will be explained with reference to FIGS. 12A to 12B. A difference from Embodiment 1 is that squares of the heavily doped n type isolated semiconductor layer 61 are lined in only one row around the element separating trench 9.

According to Embodiment 4, in the work of creating a mask drawing of an integrated circuit, the above layer 61, trench 9, and FET can be registered and operated as a set of data and the efficiency of the mask layout work can be improved. The numeric data amount for mask creation can be decreased substantially, so that the cost for computer processing for mask creation can be reduced.

Embodiment 5

Figure 13:
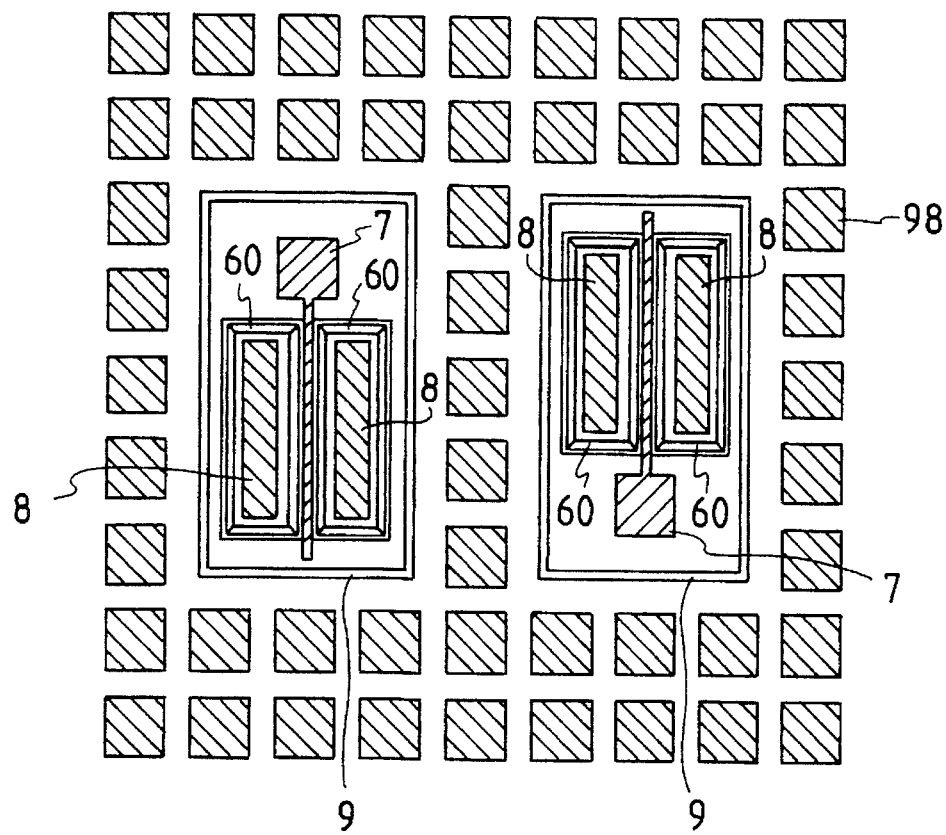
FIG. 13 is a plan view of the element separating structure of Embodiment 5 of the present invention.

Next, Embodiment 5 of the present invention will be explained with reference to FIG. 13. A difference from Embodiment 1 is that isolated ohmic electrodes 98 are used in place of the heavily doped n type isolated semiconductor layer 61. The electrodes 98 are not wired and the potentials thereof are all floating.

According to Embodiment 5, the electrodes 98 which are of an isolated pattern can be formed by a process which is independent of the heavily doped n type selective growth layer 60. For example, the forming process for the layer 60 can be changed, for example, to an ion implantation method and the degree of freedom of process can be increased.

As obvious in the above Embodiments 1 to 5, according to the present invention, the low frequency oscillation phenomenon in the field effect transistors and integrated circuit thereof can be controlled, and when element separating trenches which reach the hetero junction interface are formed, the control of the sidegate effect is greatly improved, and an integrated circuit and optical regenerative repeater having compound semiconductor field effect transistors which are most suited to superspeed operation can be provided.

Embodiment 6

The creation procedure for Embodiment 6 of the semiconductor device of the present invention will be explained with reference to FIGS. 15 to 18.

Figure 15:
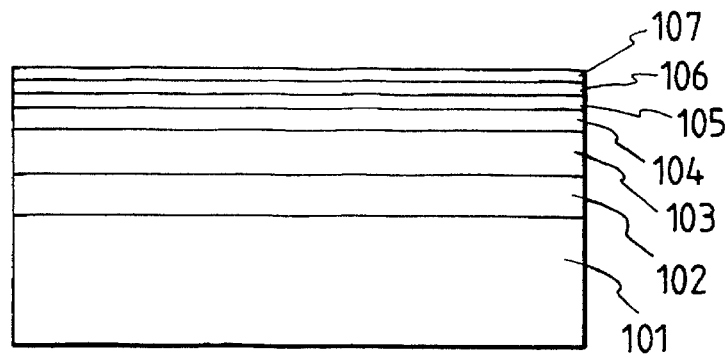

FIG. 15 is a process diagram (1) for manufacturing the semiconductor device in Embodiment 6 of the present invention. On a semi-insulating GaAs substrate 101 which is formed by crystal growth by the LEC (liquid encapslated Czockralski) method, a layer 103 including GaAs layer 102 (300 nm), non-doped $Al_xGa_{1-x}As$ layer (50 nm), non-doped GaAs layer (50 nm), non-doped $Al_xGa_{1-x}As$ layer (50 nm), non-doped GaAs layer (50 nm), and non-doped $Al_xGa_{1-x}As$ layer (50 nm) are laminated one by one (the total thickness of the non-doped $Al_xGa_{1-x}As$ layers is 150 nm), a p type GaAs layer 104 (150 nm, $6.0 \times 10^{16}$ $cm^{-3}$ of Be is contained as an impurity), an n type GaAs active layer 105 (15 nm, $5.3 \times 10^{18}$ cm of Si is contained as an impurity), a non-doped AlGaAs layer 106 (10 nm), and a non-doped GaAs layer 107 (5 nm) are allowed to grow by the MBE (molecular beam epitaxy) method. The Al composition ratio x of the non-doped $Al_xGa_{1-x}As$ layers 103 and 106 is 0.3.

Figure 16:
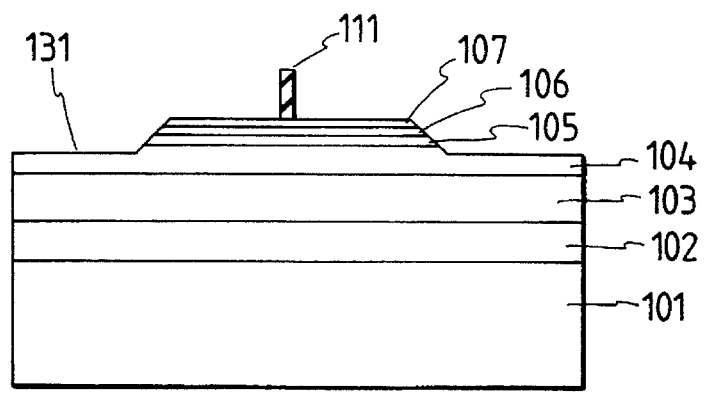

FIG. 16 is a process diagram (2) for manufacturing the semiconductor device in Embodiment 6 of the present invention. An etched region 131 with a depth of 100 nm is formed by the wet etching method and a gate electrode 111 is formed by the photolithography technique. WSix (tungsten silicide) is used as a gate metal and the thickness thereof is 600 nm.

Figure 17:
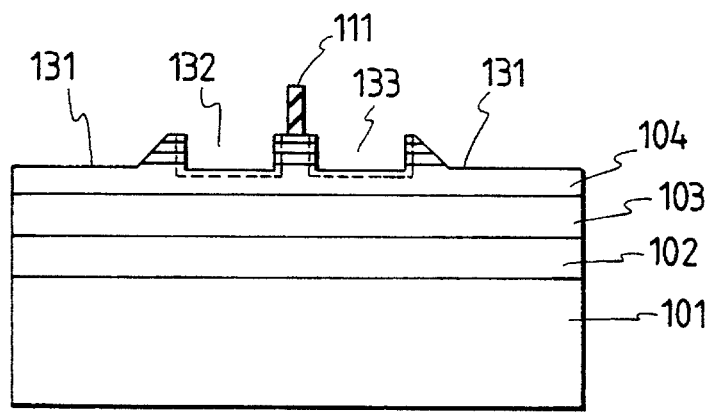

FIG. 17 is a process diagram (3) for manufacturing the semiconductor device in Embodiment 6 of the present invention. Ions are implanted in the source and drain regions (ion type: Si, dose amount: $5 \times 10^{13}$ $cm^{-2}$) and ohmic electrode layer forming trenches 132 and 133 with a depth of 50 nm are formed one by one by the dry etching method. $SiCl_4$ is used as etching gas.

FIG. 18 is a process diagram (4) for manufacturing the semiconductor device in Embodiment 6 of the present invention. Next, n type GaAs layers 141 and 142 (320 nm, $4.0 \times 10^{18}$ $cm^{-3}$ of Si is included as an impurity) are foraged by selective growth by the MOCVD (metal organic chemical vapor deposition) method. Then, source electrodes 112 and drain electrodes 113 are formed by the lift-off method and alloyed to ohmic electrodes at 400° C. so as to form an FET. The metals and thicknesses used for the source electrodes 112 and drain electrodes 113 are as follows: AuGe: 60 nm, W: 10 nm, Ni: 10 nm, Au: 120 nm. Finally, an ohmic electrode 114 is formed on the back of the substrate and the potential of the electrode 114 is fixed.

Figure 14:
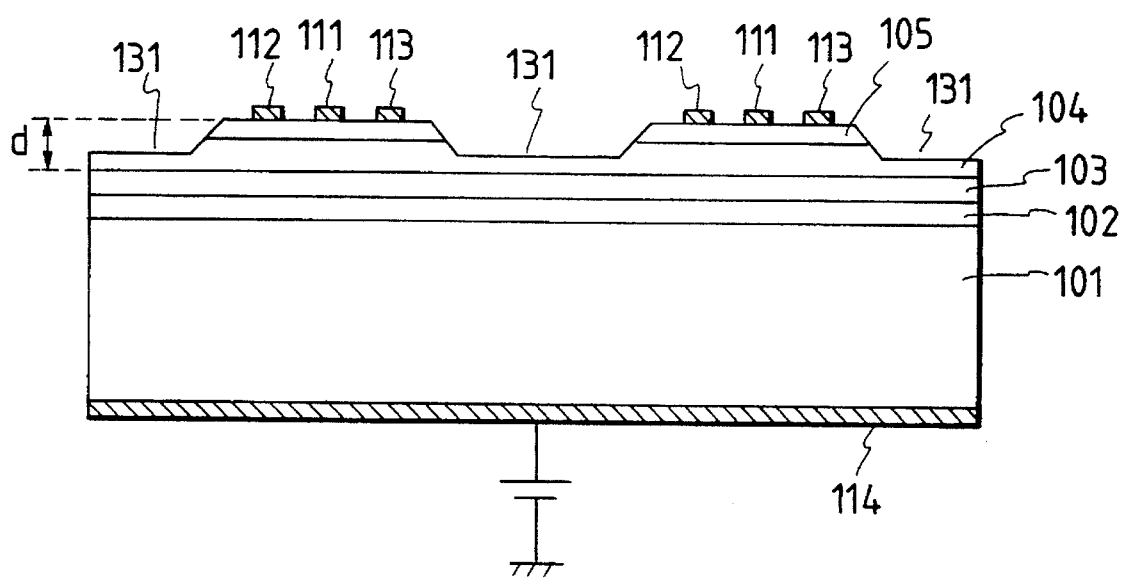
FIG. 14 is a sectional structure diagram for explaining the principle of another element separating structure of the present invention.
Figure 22:
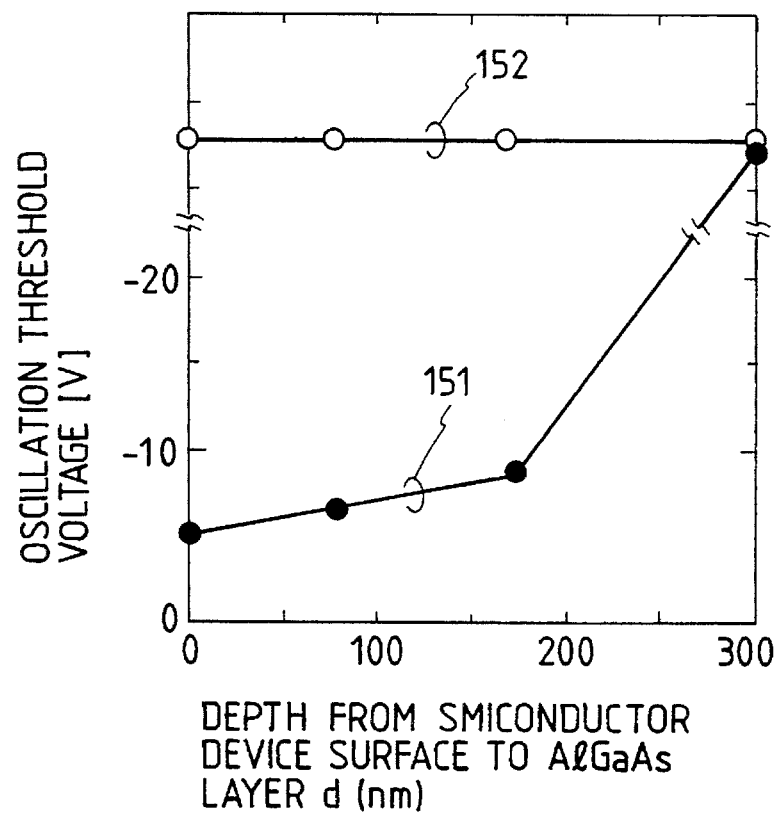
FIG. 22 is a graph for explaining the low frequency oscillation prevention effect of the present invention.

When the semiconductor device in Embodiment 6 is used, as shown in a characteristic line 152 in FIG. 22, the oscillation threshold voltage of low frequency oscillation can be improved to at most −20 V though the depth d is as shown in FIG. 14.

Embodiment 7

FIG. 19 is a sectional view of the semiconductor in Embodiment 7. The semiconductor device in Embodiment 7 can be created by the same process procedure as that of Embodiment 6. Differences of Embodiment 7 from Embodiment 6 are (1) the layer 103 is a single non-doped $Al_xGa_{1-x}As$ layer with a thickness of 300 nm and (2) ions are implanted in the source and drain regions (ion type: Si, dose amount: $5 \times 10^{13}$ $cm^{-2}$) and trenches with a depth of 100 nm are formed between field effect transistors by the dry etching method. $SiCl_4$ is used as etching gas for forming the trenches 134. The width of the trenches 134 is 1 μm. It is necessary that the trenches 134 reach at least the non-doped $Al_xGa_{1-x}As$ layer 103. The trenches 134 may be formed after the source electrodes 112 and drain electrodes 113 are formed.

According to Embodiment 7, as compared with Embodiment 6, the trenches 134 reach the non-doped $Al_xGa_{1-x}As$ layer 103, so that the sidegating threshold voltage can be improved.

Embodiment 8

FIGS. 20A and 20B are plan views of the semiconductor in Embodiment 8. The semiconductor device in Embodiment 8 can be created by the same process procedure as that of Embodiment 7. A difference of Embodiment 8 from Embodiment 7 is that the trenches 134 with a depth of 100 nm are formed by the dry etching method and enclose the field effect transistors.

According to Embodiment 8, as compared with Embodiment 7, since the trenches 134 are formed so as to enclose the field effect transistors the sidegating threshold voltage can be improved.

Embodiment 9

Figure 21:
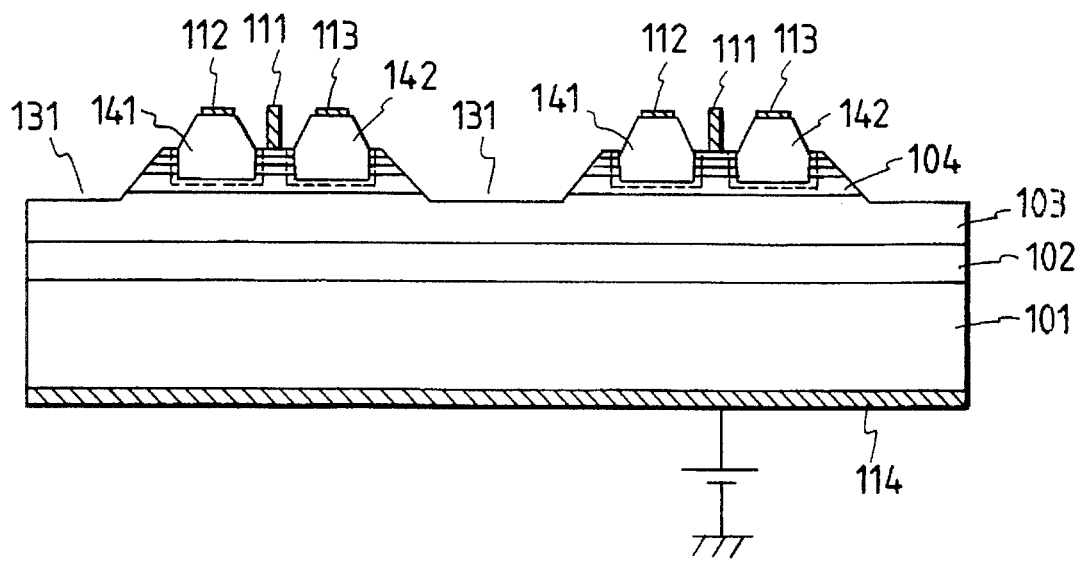
FIG. 21 is a sectional view of the semiconductor device of Embodiment 9 of the present invention.

FIG. 21 is a sectional view of the semiconductor in Embodiment 9. The semiconductor device in Embodiment 9 can be created by the same process procedure as that of Embodiment 8. Differences of Embodiment 9 from Embodiment 8 are (1) the thickness of the p type GaAs layer 104 is 50 nm and the concentration of Be as an impurity is $1.8 \times 10^{17}$ $cm^{-3}$ and (2) the process of forming trenches 134 by the dry etching method is omitted. According to Embodiment 9, the thickness of the p type GaAs layer 104 is ⅓ of that of Embodiment 6 and the concentration of Be as an impurity is 3 times of that of Embodiment 6. Therefore, the threshold voltage of the FETs in Embodiment 9 matches the threshold voltage of the FETs in Embodiment 6.

According to Embodiment 9, as compared with Embodiment 8, the thickness of the p type GaAs layer 104 is reduced to 50 nm. By doing this, the crystal growth time and raw material of GaAs can be saved, so that the cost can be decreased.

The depth of the trenches 131 by the wet etching method is 100 nm which is the same as that of Embodiment 6. Since the trenches 131 reach the non-doped $Al_xGa_{1-x}As$ layer 103, the of forming process the trenches 134 by the dry etching method can be omitted. Since the process of forming the trenches 134 is omitted, the process procedure can be simplified and the production cost can be decreased.

According to Embodiments 6 to 9, the layer 103 is a non-doped $Al_xGa_{1-x}As$ layer. However, an $Al_xGa_{1-x}As$ layer doped with oxygen at 1 to $3 \times 10^{18}$ cm$^{-3}$ may be used. In this case, the sidegating threshold voltage can be further improved.

According to Embodiments 6 to 9, a semiconductor crystal having the above structure is used. However, when the total thickness of the non-doped $Al_xGa_{1-x}As$ layer 103 is at least 150 nm, the semiconductor layer thickness and use or non-use, type, and concentration of impurities may be changed. For example, even when the p type GaAs layer 104 is a non-doped GaAs layer, the effect of the present invention is not changed.

Even when the thickness of the buffer layer of the compound semiconductor shown in Embodiments 6 to 9 is more than 100 nm, the oscillation threshold voltage of low frequency oscillation of the FET drain current is increased and a highly reliable integrated circuit can be created. Furthermore, element separating trenches can be made shallow and the trench forming time is reduced, so that the production cost can be decreased.

Embodiment 10

A semiconductor integrated circuit using FETs of Embodiment 10 of the present invention will be explained with reference to FIGS. 23 to 28.

Figure 23:
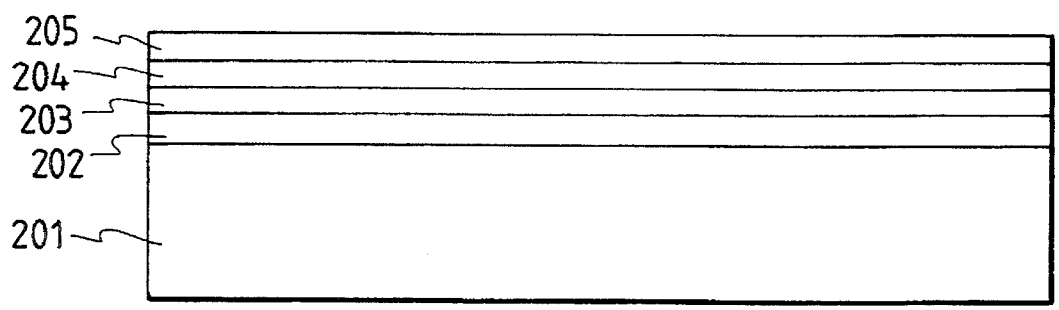
FIGS. 23 to 26 are sectional views showing the manufacturing processes of a semiconductor integrated circuit using FETs of Embodiment 10 of the present invention.

On a semi-insulating GaAs substrate 201 which is created by the LEC (liquid encapslated Czockralski) method, a non-doped GaAs layer 202 (1500 Å thick), non-doped AlGaAs layer 203 (1000 Å thick), non-doped GaAs layer 204 (500 Å), and n type GaAs layer 205 (1000 Å thick, $2.5 \times 10^{17}$ cm$^{-3}$ of Si is contained as an impurity) are allowed to grow one by one at a substrate temperature of 580° C. by the MBE method. The Al composition ratio of the non-doped AlGaAs layer 204 is 0.3 (FIG. 23). One of or both of the GaAs layers 202 and 204 may be replaced with a p type GaAs layer.

Figure 24:
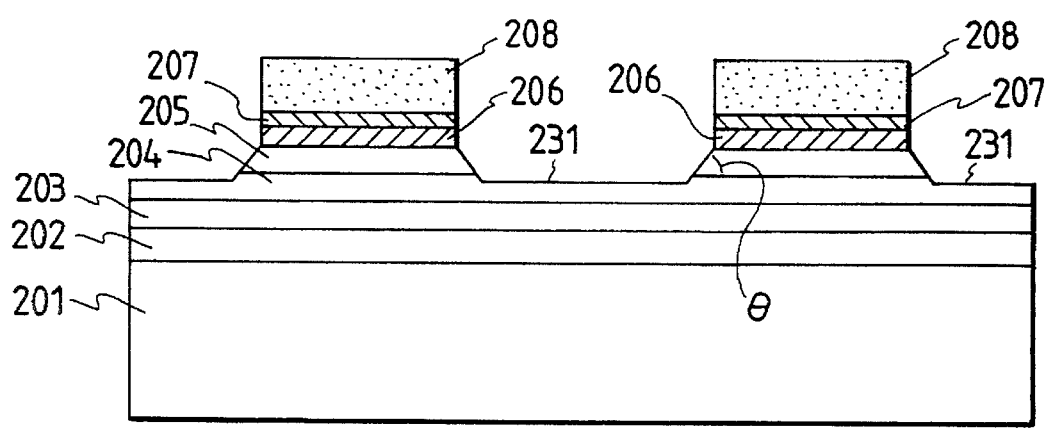

Then, a silicon dioxide layer 206 with a thickness of 300 Å and a silicon layer 207 with a thickness of 1000 Å are deposited, and resist 208 is formed by the photolithography technique, and the silicon dioxide layer 206 and silicon layer 207 are removed using the resist 208 as a mask. Thereafter, etched regions 231 with a depth of 1500 Å are formed by the wet etching method so as to enclose the regions which will be element regions of field effect transistors. The etched regions 231 go through the n type GaAs layer 205 and reach the non-doped GaAs layer 204. A mixed solution of hydrofluoric acid, hydrogen peroxide, and water (their ratio is 4:1:20) is used as etchant to be used for wet etching. The inclination of the side of each etched region is about 40° (angle θ of the n type GaAs layer 205 on the etched region side) (FIG. 24).

Next, the resist 208 is removed and silicon layer 207 using $CF_4$ is removed. Next, resist (not shown in the drawing) is coated, and an aperture pattern with a width of 1 μm for enclosing the periphery of the element region is formed in each of the etched regions 231, and trenches 232 with a width of 1 μm which go through the non-doped GaAs layer 204 and non-doped AlGaAs layer 203 and reach the non-doped GaAs layer 202 are formed by the RIE (reactive ion etching) method. $SiCl_4$ is used as etching gas. Since the trenches 232 reach the non-doped AlGaAs layer 203, the elements can be separated surely. The side of each of the trenches 232 is formed so as to be almost perpendicular to the surface of the semiconductor device.

Figure 25:
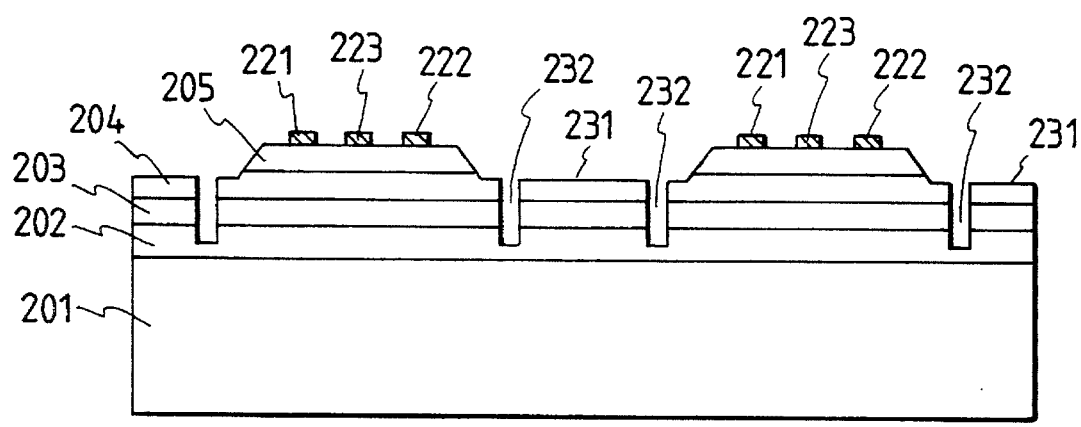

Next, source electrodes 221 and drain electrodes 222 are formed by the lift-off method and alloyed at 400° C. so as to form ohmic electrodes. The metals and thicknesses used for the electrodes 221 and 222 are as follows: AuGe: 600 Å, W: 100 Å, Ni: 100 Å, Au: 1200 Å. Furthermore, by forming Schottky barrier gate electrodes 223, an FET is formed. The metals and thicknesses used for the gate electrodes are as follows: Ti: 500 Å, Pt: 500 Å, Au: 2000 Å (FIG. 25).

Next, an insulator 241 is formed so as to smooth the surface of the semiconductor device. The insulator 241 is formed by plasma deposition of a silicon dioxide layer with a thickness of 2000 Å, coating of an organic insulating layer with a thickness of about 2000 Å, and plasma deposition of a silicon dioxide layer with a thickness of 3000 Å. Thereafter, an inter-element wire 242 is formed (FIG. 26).

There is no etching residue of the wire material in the wire forming process and a semiconductor integrated circuit with no wire short-circuit can be created.

Figure 26:
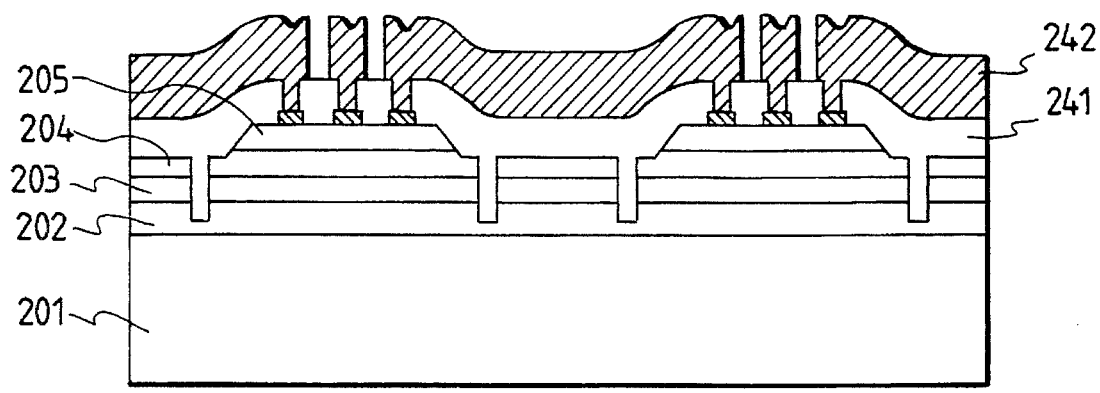
Figure 27:
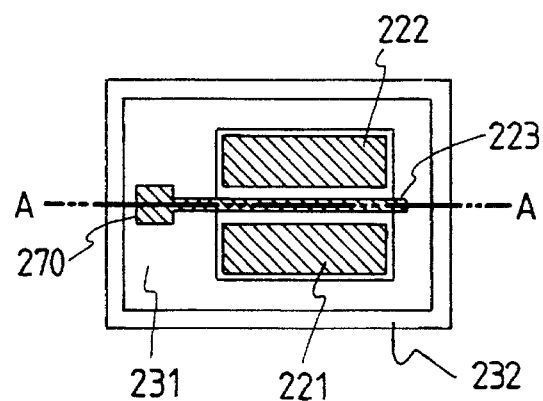
FIG. 27 is a plan view of the semiconductor integrated circuit shown in FIG. 26.
Figure 28:
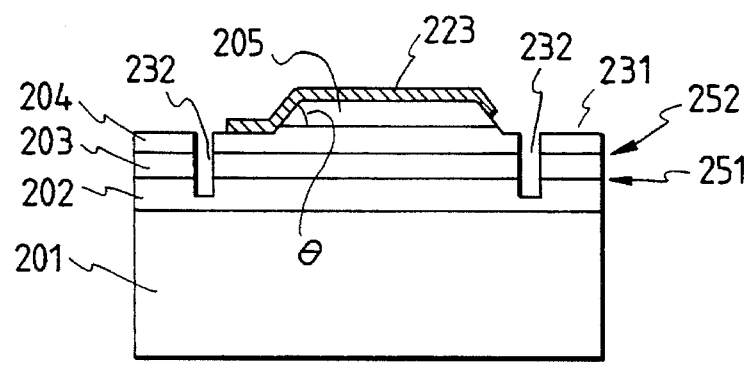
FIG. 28 is a sectional view of the semiconductor integrated circuit shown in FIG. 27 in the perpendicular direction (A—A line) of the paper sheet of FIG. 27.

FIG. 27 is a plan view of the structure shown in FIG. 26 and FIG. 28 is a sectional view taken on the AA line of FIG. 27. In FIG. 28, numerals 251 and 252 indicate hetero interfaces.

Embodiment 11

Figure 29:
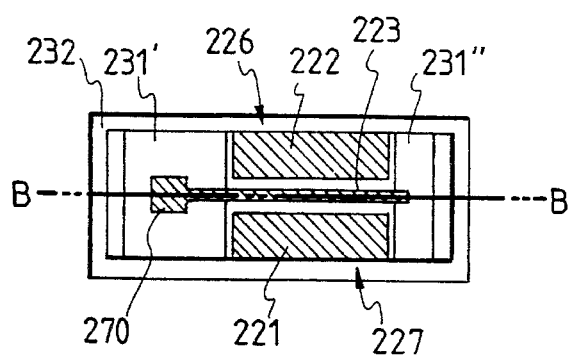
FIG. 29 is a plan view of a semiconductor integrated circuit using FETs of Embodiment 11 of the present invention.
Figure 30:
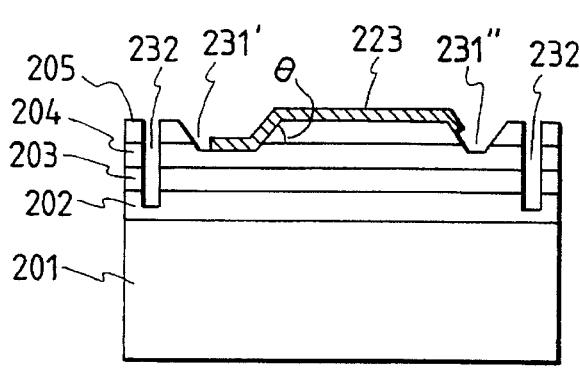
FIG. 30 is a sectional view of a semiconductor integrated circuit using FETs of Embodiment 11 of the present invention.
Figure 31:
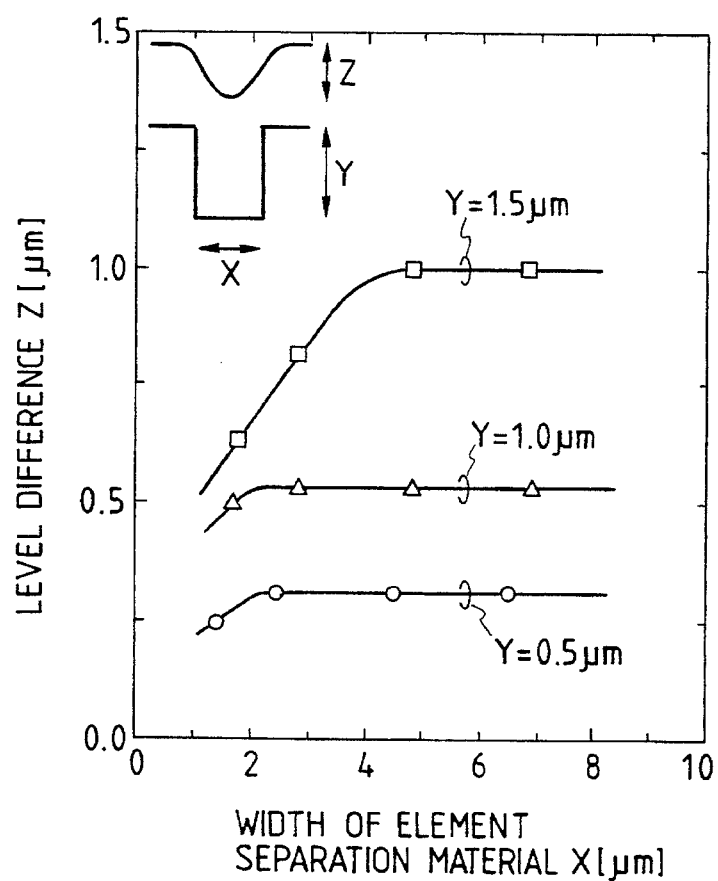
FIG. 31 is a graph showing the relationship between the level difference and width of a material separating adjacent elements.

A semiconductor integrated circuit using FETs of Embodiment 11 of the present invention will be explained with reference to FIGS. 29 and 30. FIG. 29 is a plan view and FIG. 30 is a sectional view taken on the BB line of FIG. 29. A difference from the semiconductor integrated circuit of Embodiment 10 is that the sides 226 and 227 of the element region are in contact with the sides of the trench 232 with a width of 1 μm. Etched regions which correspond to the etched regions 231 in Embodiment 10 are only etched regions 231' and 231". The trench 232 is created by dry etching, so that the sides thereof are perpendicular to the surface of the element region. Since the width of the trench 232 is narrow such as 1 μm, a semiconductor integrated circuit with no wire short-circuit can be created. The integration density is higher than that of Embodiment 10 due to structural characteristics of the above embodiment.

There is no need to form the etched region 231" when the masking dislocation is within the tolerance and it is necessary to form only the trench 232 in the same as with the sides 226 and 227. When the etched region 231" is not formed, the masking in the gate width direction is required to be performed twice when creating the etched region 231' and the trench 232. However, when the masking dislocation is within the tolerance, there is no need to form them.

As obvious in Embodiments 10 and 11, when etched regions are formed at least on the gate pad side and element separating materials with a width of at most 2 μm are formed in place so as to enclose the element regions, a semiconductor integrated circuit with no wire short-circular can be provided without the integration density being greatly decreased compared with that when only the wet etching method is used.

What is claimed is:

1. A compound semiconductor integrated circuit comprising a semi-insulating substrate, a plurality of field effect transistors formed on said substrate, and element separating trenches formed between neighboring ones of said plurality of field effect transistors, wherein a plurality of isolated conductive layers are formed in contact with a semiconductor surface between said neighboring ones of said plurality of field effect transistors.

2. A compound semiconductor integrated circuit according to claim 1, wherein said plurality of isolated conductive layers are a plurality of isolated semiconductor layers.

3. A compound semiconductor integrated circuit according to claim 2, wherein said element separating trenches are deep enough to reach said semi-insulating substrate.

4. A compound semiconductor integrated circuit according to claim 3, wherein said element separating trenches enclose each of said field effect transistors and a plurality of said isolated semiconductor layers are arranged outside said element separating trenches.

5. A compound semiconductor integrated circuit according to claim 4, wherein said isolated semiconductor layers are arranged at even intervals and said interval is shorter than the width of said isolated semiconductor layers, said width being a size measured along a direction perpendicular to the direction of arranging said isolated semiconductor layers with said intervals between them.

6. A compound semiconductor integrated circuit according to claim 2, wherein said compound integrated circuit has a buffer layer on which a semiconductor layer is deposited on a side of the buffer layer opposite that of the substrate to form a heterojunction at the interface of said buffer layer and said semiconductor layer, and each of the energy differences between the Fermi level and the bottom level of conduction band and between the Fermi level and the top level of valence band is larger in said buffer layer than in said semiconductor layer sharing the heterojunction with said buffer layer, and said element separating trenches have the depth of reaching at least said heterojunction interface.

7. A compound semiconductor integrated circuit according to claim 6, wherein said element separating trenches enclose each of said field effect transistors and a plurality of said isolated semiconductor layers are arranged outside said element separating trenches.

8. A compound semiconductor integrated circuit according to claim 7, wherein said isolated semiconductor layers are arranged at even intervals and said interval is shorter than the width of said isolated semiconductor layers, said width being a size measured along a direction perpendicular to the direction of arranging said isolated semiconductor layers with said intervals between them.

9. A compound semiconductor integrated circuit according to claim 1, wherein said isolated conductive layer is an ohmic electrode which is floating electrically and is not electrically connected to said field effect transistors.

10. A compound semiconductor integrated circuit according to claim 1, wherein said element separating trenches are filled with an insulator.

11. A compound semiconductor integrated circuit according to claim 6, wherein the thickness of said buffer layer is more than 100 nm.

12. A compound semiconductor integrated circuit according to claim 6, wherein the thickness of said buffer layer is at least 130 nm.

13. A compound semiconductor integrated circuit according to claim 6, wherein the thickness of said buffer layer is at least 150 nm.

14. A compound semiconductor integrated circuit according to claim 13, wherein the distance from the surface of an uppermost semiconductor layer to said buffer layer is less than 300 nm.

15. A compound semiconductor integrated circuit comprising a semi-insulating substrate, a plurality of field effect transistors formed on said substrate, and element separating trenches formed between neighboring ones of said plurality of field effect transistors, wherein a plurality of isolated conductive layers are formed in contact with a semiconductor surface between said neighboring ones of said plurality of field effect transistors wherein said plurality of isolated conductive layers are a plurality of isolated semiconductor layers and wherein said compound integrated circuit has a buffer layer on which a semiconductor layer is deposited on a side of the buffer layer opposite that of the substrate to form a heterojunction at the interface of said buffer layer and said semiconductor layer, and each of the energy differences between the Fermi level and the bottom level of conduction band and between the Fermi level and the top level of valence band is larger in said buffer layer than in said semiconductor layer the heterojunction with said buffer layer, and said element separating trenches have the depth of reaching at least said heterojunction interface wherein said element separating trenches are at most 2 μm in width and filled with an insulator, and the sides thereof are perpendicular to the surface of the element regions of said field effect transistors, and etched regions are formed at least on gate pad sides of said element regions, and each of said element separating trenches have a structure selected from the group consisting of a structure enclosing the periphery of said element regions and said etched regions and a structure enclosing said element regions in said etched regions, and the sides of said etched regions are at an angle between 10° and 60° against the semiconductor layer surface in said element regions.

16. A compound semiconductor integrated circuit comprising a substrate, a semi-insulating first semiconductor layer formed on said substrate, element regions of field effect transistors formed on said first semiconductor layer, and element separating materials which are formed between said element regions and reach said first semiconductor layer from the surface of said element regions, wherein a semiconductor layer is deposited on said first semiconductor layer on the side opposite that of said substrate to form a heterojunction at the interface shared with said first semiconductor layer, and each of the energy differences between the Fermi level at said heterojunction and the bottom level of conduction band and between the Fermi level at said heterojunction and the top level of valence band is larger in said first semiconductor layer than in said semiconductor layer sharing the heterojunction with said first semiconductor layer, and said element separating materials are comprised of an insulator and the sides thereof are perpendicular to said surface of said element region, and etched regions are formed on a gate pad side of said element regions, and the sides of said etched regions in the gate width direction are slopes which are inclined from the surface of said element regions toward the center of said etched regions in the depth direction, and said element separating materials are formed so as to enclose the periphery of said element regions and said etched regions, and the width thereof is at most 2 μm.

17. A compound semiconductor integrated circuit according to claim 16, wherein said integrated circuit comprises a semi-insulating second semiconductor layer formed between said substrate and said first semiconductor layer and a third semiconductor layer formed between said first semiconductor layer and said element regions and said third semiconductor layer is said semiconductor layer deposited on said first semiconductor layer.

18. A compound semiconductor integrated circuit according to claim 17, wherein said substrate is a semi-insulating GaAs substrate, and said first semiconductor layer is an AlGaAs layer, and said second semiconductor layer is a GaAs layer, and said third semiconductor layer is a semi-insulating GaAs layer, and said element regions are n type GaAs regions.

19. A compound semiconductor integrated circuit according to claim 16, wherein two sides of said element regions in the gate length direction are in contact with said element separating materials.

20. A compound semiconductor integrated circuit comprising a substrate, a semi-insulating first semiconductor layer formed on said substrate, element regions of field effect transistors formed on said first semiconductor layer, and element separating materials which are formed between said element regions and reach said first semiconductor layer from the surface of said element regions, wherein a semiconductor layer is deposited on said first semiconductor layer on a side opposite that of said substrate to form a heterojunction at the interface shared with said first semiconductor layer, and each of the energy differences between the Fermi level at said heterojunction and the bottom level of conduction band and between the Fermi level at said heterojunction and the top level of valence band is larger in said first semiconductor layer than in said semiconductor layer sharing the heterojunction with said first semiconductor layer, and said element separating materials are comprised of an insulator, and the sides thereof are perpendicular to said surface of said element region, and etched regions are formed so as to enclose the periphery of said element regions, and said element separating materials are formed so as to enclose said element regions in said etched regions, and said etched regions are filled with an insulator, and wires are formed on said insulator, and the sides of said etched regions which the wires pass through are slopes which are inclined from the surface of said element regions toward the center of said etched regions in the depth direction.

21. A compound semiconductor integrated circuit according to claim 20, wherein the width of said element separating materials is at most 2 μm.

22. A compound semiconductor integrated circuit according to claim 21, wherein said integrated circuit comprises a semi-insulating second semiconductor layer formed between said substrate and said first semiconductor layer and a third semiconductor layer formed between said first semiconductor layer and said element regions and said third semiconductor layer is said semiconductor layer deposited on said first semiconductor layer.

23. A compound semiconductor integrated circuit according to claim 22, wherein said substrate is a semi-insulating GaAs substrate, and said first semiconductor layer is an AlGaAs layer, and said second semiconductor layer is a GaAs layer, and said third semiconductor layer is a semi-insulating GaAs layer, and said element regions are n type GaAs regions.

24. An optical regenerative repeater comprising a timing extracting circuit composed of a limit amplifier integrated circuit which is formed by combining a plurality of basic amplifiers including a plurality of FETs and a plurality of diodes each of which is composed of a FET having a source and a drain short-circuited each other, said basic amplifiers having a structure of a compound semiconductor integrated circuit comprising a semi-insulating substrate, a plurality of field effect transistors formed on said substrate, and element separating trenches formed between said neighboring field effect transistors, wherein a plurality of isolated conductive layers are formed in contact with a semiconductor surface between said neighboring field effect transistors.

* * * * *

UNITED STATES PATENT AND TRADEMARK OFFICE
CERTIFICATE OF CORRECTION

PATENT NO. : 5,523,593
DATED : June 4, 1996
INVENTOR(S) : Osamu Kagaya et al.

It is certified that error appears in the above-indentified patent and that said Letters Patent is hereby corrected as shown below:

| Column | Line | |
|---|---|---|
| 5 | 39 | Change "semi-inoculating" to --semi-insulating--. |
| 5 | 49 | Change "i)it" to --i) it--. |
| 6 | 31 | Change "shoot-circuit" to --short-circuit-- |
| 7 | 37 | After "invention" insert --.--.<br><br>--the process of forming--. |
| 14 | 64 | Change "short-circular" to --short-circuit--. |

UNITED STATES PATENT AND TRADEMARK OFFICE
CERTIFICATE OF CORRECTION

PATENT NO.  : 5,523,593
DATED       : June 4, 1996
INVENTOR(S) : Osamu Kagaya, et al.

It is certified that error appears in the above-indentified patent and that said Letters Patent is hereby corrected as shown below:

| Column | Line | |
|---|---|---|
| 2 | 13 | Change "trenchers" to --trenches--. |
| 2 | 65 | Change "transistorize" to --transistors--. |
| 4 | 50 | Change "thee" to --the--. |
| 5 | 1 | Change "deed" to --deep--. |

Signed and Sealed this

Fifth Day of November, 1996

Attest:

BRUCE LEHMAN

Attesting Officer    Commissioner of Patents and Trademarks